(12) United States Patent
Al-Absi et al.

(10) Patent No.: US 11,329,631 B1
(45) Date of Patent: May 10, 2022

(54) TUNABLE GROUNDED POSITIVE AND NEGATIVE IMPEDANCE MULTIPLIER

(71) Applicant: King Fahd University of Petroleum and Minerals, Dhahran (SA)

(72) Inventors: Munir Al-Absi, Dhahran (SA); Muhammad T. Abuelma'atti, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 16/454,580

(22) Filed: Jun. 27, 2019

(51) Int. Cl.
 H03H 11/02 (2006.01)
 H03F 3/45 (2006.01)

(52) U.S. Cl.
 CPC ......... *H03H 11/02* (2013.01); *H03F 3/45475* (2013.01); *H03F 2200/153* (2013.01); *H03F 2203/45116* (2013.01)

(58) Field of Classification Search
 CPC ............... H03H 11/02; H03F 3/45475; H03F 2200/153; H03F 2203/45116
 USPC ........................................................ 327/561
 See application file for complete search history.

(56) References Cited

U.S. PATENT DOCUMENTS

| | | | | |
|---|---|---|---|---|
| 4,562,406 | A | * 12/1985 | Baker | ............... H03F 3/347 330/85 |
| 5,789,973 | A | 8/1998 | Barret, Jr. et al. | |
| 8,854,148 | B1 | * 10/2014 | Abuelma'atti | ........... H03B 5/26 331/135 |

OTHER PUBLICATIONS

Al-Absi, et al. ; A Novel Tunable Grounded Positive and Negative Impedance Multiplier; Mar. 2018 ; 5 Pages.
Kamat, et al. ; Active-RC filters using two-stage OTAs with and without feed-forward compensation ; IET Circuits, Devices & Systems ; Mar. 24, 2011 ; 9 Pages.
Kamath, et al. ; Novel DO-OTA based current-mode grounded capacitor multiplier; ICISC 2018 ; 4 Pages.

* cited by examiner

*Primary Examiner* — Tomi Skibinski
(74) *Attorney, Agent, or Firm* — Oblon, McClelland, Maier & Neustadt, L.L.P.

(57) ABSTRACT

A tunable impedance multiplier with high multiplication factor is described. A single externally connected resistor is used and the multiplier is free of passive elements. The circuit can realize a positive or a negative impedance multiplier. Applications of the design to low and high pass filters are also presented. The simulation and experimental results show that the new design enjoys a multiplication factor above 400 at 2 Hz-to 7 MHz.

20 Claims, 18 Drawing Sheets

TUNABLE GROUNDED POSITIVE AND NEGATIVE IMPEDANCE MULTIPLIER

STATEMENT OF ACKNOWLEDGEMENT

The author would like to acknowledge the financial support provided by the King Fand University of Petroleum and Minerals KFUPM), Riyadh, Saudi Arabia through Project #IN161016.

STATEMENT OF PRIOR DISCLOSURE

Aspects of this technology are described in an article "A Novel Tunable Grounded Positive and Negative Impedance Multiplier" published in IEEE Transaction on Circuits and System II: Express Briefs on Oct. 8, 2018, DOI: 10.1109/TCSII.2018.2874511, which is incorporated herein by reference in its entirety.

BACKGROUND

Technical Field

The present disclosure is directed to a tunable grounded impedance multiplier. The impedance multiplier provides positive or negative impedance scaling.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

The impedance multiplier is an important building block in many electronics applications; for example in the simulation of large values of passive elements that cannot be integrated. (See I. Padilla-Cantoya, L. Rizo-Dominguez and J. Molinar-Solis, "Capacitance multiplier with large multiplication factor high accuracy and low power and silicon area for floating applications," IEICE Electronics Express, 2018, incorporated herein by reference in its entirety). Many approaches to increase the effective value of the capacitance or resistance have been reported in the literature. In Ahmed et al., an operational transconductance amplifier (OTA)-based tunable C-multiplier was developed. However, this design is for capacitor scaling up only and it uses three OTAs in which the multiplication factor is tuned using the OTAs' bias currents. (See M. T Ahmed, L A Khan and N. Minhah, "Novel electronically tunable C-multiplier," Electronics Letters, Vol. 31 No. 1, pp. 9-11, 1995, incorporated herein by reference in its entirety). An impedance scaler was presented in Martinez and Alejandro using MOSFETs. (See J. Silva Martinez and Alejandro, "Impedance scalers for IC active filters," IEEE International Symposium On Circuits And Systems, pp. 51-154, 1998, incorporated herein by reference in its entirety). This impedance scaler has a small footprint on a chip. However, the scaling factor is controlled by the aspect ratios of the transistors used. This means that, once fabricated, the scaling factor cannot be controlled.

Another approach was developed by Abuelma'tti et al. In this approach, three current-controlled current amplifiers were used in addition to an external resistor. (See M. T Abuelma'tti and N. A Tasadduq, "Electronically tunable capacitance multiplier and frequency-dependent negative resistance simulator using the current-controlled current conveyor," Microelectronics Journal, pp. 869-873, 1999, incorporated herein by reference in its entirety). A further design by Solis-Bustos et al. uses current mirrors as core blocks to scale up capacitance using the mirrors aspect ratio. (See S. Solis-Bustos, H. Silva and E. Sanches, "A 60-dB dynamic-Range CMOS sixth-order 2.4-Hz low-pass filter for medical applications," IEEE Transactions On Circuits And Systems, Analog And Digital Signal Processing, Vol. 47. No. 12, pp. 1391-1398, 2000, incorporated herein by reference in its entirety). However, the controllability of the multiplication factor is restricted by the device's aspect ratios.

A universal immittance (admittance and impedance as a combined concept) function simulator using a current conveyor was reported by Cicekoglu et al. (See O. Cicekoglu, A. Toker and H. Kuntman, "Universal immitance function simulators using current conveyors," Computers And Electrical Engineering, pp. 227-238, 2001, incorporated herein by reference in its entirety). In this design, three CCIIs are used. Moreover, external resistors are used to control the multiplication factor.

In Khan et al., current conveyor based R- and C-multiplier circuits were developed. (See A. Khan, S. Bimal, K. Dey and S. Roy, "Current conveyor based R- and C-multiplier circuits," International Journal Of Electronics And Communications", Vol. 56, No. 5, pp. 312-316, 2002, incorporated herein by reference in its entirety). However, the value of R and C are controlled by two other resistors. Another capacitance multiplier was reported by Kulej. (See T. Kulej, "Regulated capacitance multiplier in CMOS technology, "In International Conference On Mixed Design Of Integrated Circuits And Systems, pp. 316-319, 2009, incorporated herein by reference in its entirety). This design used three OTAs and two-equal value capacitors and implements capacitance multiplier only. In Padilla et al. an enhanced grounded capacitor multiplier was presented. (See I. Padilla and P. Furth," Enhanced grounded capacitor multiplier and its floating implementation for analog filter," IEEE Transaction On Circuits And System-II: Express Briefs, Vol. 62. Issue 10, pp. 962-966, 2015, incorporated herein by reference in its entirety). The design is based on using the differential amplifier with exponential current scaling.

A new compact impedance scaler was reported by Al-Absi et al. (See M. Al-Absi, E. Al-Suhaibani and M. Abuelma'tti, "A new controllable CMOS impedance scaler," In International Multi-Conference on Systems, Signals & Devices, 21-24, Leipzig, Germany, pp. 695-698, March 2016, incorporated herein by reference in its entirety). This design is good for capacitance scaling only. A new capacitance super multiplier was presented in Germanovix et al. (See W. Germanovix, E. Bonizzoni and F. Maloberti, "Capacitance super multiplier for sub-Hertz low-pass integrated filters," IEEE Transaction on circuits and system-II: Express Briefs, Vol. 65. No. 3, pp. 301-305, March. 2018, incorporated herein by reference in its entirety). The design used a current mirror for capacitance multiplication and cannot be tuned once fabricated and the multiplication factor is 140. The design presented by Solis-Bustos et al. uses the current mirror aspect ratio to scale up the basic capacitance and cannot be tuned once fabricated. (See S. Solis-Bustos, J. Silva-Martinez, F. Maloberti, and E. Sanchez-Sinencio, "A 60-dB dynamic-range CMOS sixth-order 2.4-Hz low-pass filter for medical applications," IEEE Transactions on Circuits and Systems-II: Analog and Digital Signal Processing, Vol. 47, NO. 12, pp. 1391-1398, December 2000, incorporated herein by reference in its entirety). The design in Kamath used dual output OTA and the scaling factor is 10. (See D. Kamath, "Novel DO-OTA based current-mode grounded capacitor multiplier," The second International Conference on Inventive Systems and Control, pp. 1187-1190, June 2018, incorporated herein by reference in its entirety). A capacitance super multiplier was reported by Rodriguez et al. (See E. Rodriguez, A. Casson and P. Corbishley, "A Sub hertz Nanopower Low-Pass Filter," IEEE Transaction On Circuits And Systems-II: Express Briefs, Vol. 58, No 0.6, pp. 351-355, June. 2011, incorporated herein by reference in its entirety). In this design, the multiplication factor depends on the transconductance of the MOS transistors with extremely low bias current. The maximum multiplication factor is 140.

There is a need for a tunable grounded impedance multiplier that can multiply capacitors or resistors by a large multiplication factor without relying on variations of the aspect ratios of transistors or externally connected resistors.

The present disclosure describes a tunable impedance multiplier free of passive components which provides a high multiplication factor.

SUMMARY

The tunable grounded impedance multiplier of the present disclosure may be tuned to multiply capacitors or resistors by a positive or negative multiplication factor. The multiplier may be incorporated into a low pass or high pass filter to provide an output in a precise frequency with positive or negative tunable amplitude.

In an exemplary embodiment, a tunable impedance multiplier comprises a current feedback operational amplifier, CFOA, having a first current input, a second current input, a first voltage output and a second voltage output; a first operational transconductance amplifier, $OTA_1$, having a gain $g_m$, a first positive voltage input, a first negative voltage input a first bias current input, a positive supply voltage, a negative supply voltage, and a current output. A resistance is connected to the second voltage output of the CFOA at a first end and is connected to ground at a second end. An impedance is connected to the second input of the CFOA at a first end and is connected to ground at a second end; wherein the first voltage output of the CFOA is connected to the first voltage input of $OTA_1$ and wherein the output of the $OTA_1$ is connected as feedback to the first current input of the CFOA.

In another exemplary embodiment, a method for tunably multiplying an impedance is presented, comprising connecting an alternating current source to a first current input of a current feedback operational amplifier, CFOA; connecting a second current input of the CFOA to an impedance, Z; connecting a first output of the CFOA to an inverting input of a first operational transconductance amplifier, $OTA_1$, having a specified gain, $g_m$; connecting a second output of the CFOA to a grounded resistance, $R_0$; connecting a non-inverting input of the $OTA_1$ to ground; connecting a current output of the $OTA_1$ to the first current input of the CFOA. The method continues by sweeping the amplitude of a first bias current source, connected to a bias input of the $OTA_1$ over a range of frequencies of alternating current; determining the −3 dB points of the current output corresponding to the range of frequencies; and calculating the equivalent input impedance based on the equation $$Zin = \frac{Z}{gm \times R0}.$$

In another exemplary embodiment, a method for tunably multiplying an impedance, comprises connecting an alternating current source to a first current input of a current feedback operational amplifier, CFOA; connecting a second current input of the CFOA to an impedance, Z; connecting a first output of the CFOA to an inverting input of a first operational transconductance amplifier, $OTA_1$ having a specified gain, $g_m$; connecting a non-inverting input of the $OTA_1$ to ground; connecting a current output of the $OTA_1$ to the first current input of the CFOA; connecting an inverting input of a second operational transconductance amplifier $OTA_2$ to a second voltage output of the CFOA, connecting the non-inverting input of the $OTA_2$ to ground and connecting the output of the $OTA_2$ to the inverting input of the $OTA_2$; connecting a second bias current source, $i_{B2}$, to a bias input of the $OTA_2$; sweeping the amplitudes of the first bias current source, $i_{B1}$, of the $OTA_1$ and second bias current source, $i_{B2}$, of the $OTA_2$ over a range of frequencies of alternating current determining the −3 dB points of the current output corresponding to the range of frequencies; calculating the equivalent input impedance based on the equation $$Zin = \frac{Z}{gm \times R0};$$

and calculating the multiplication of the impedance, Z, based on the equation multiplication=Z $$\frac{IB2}{IB1}.$$

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1A:
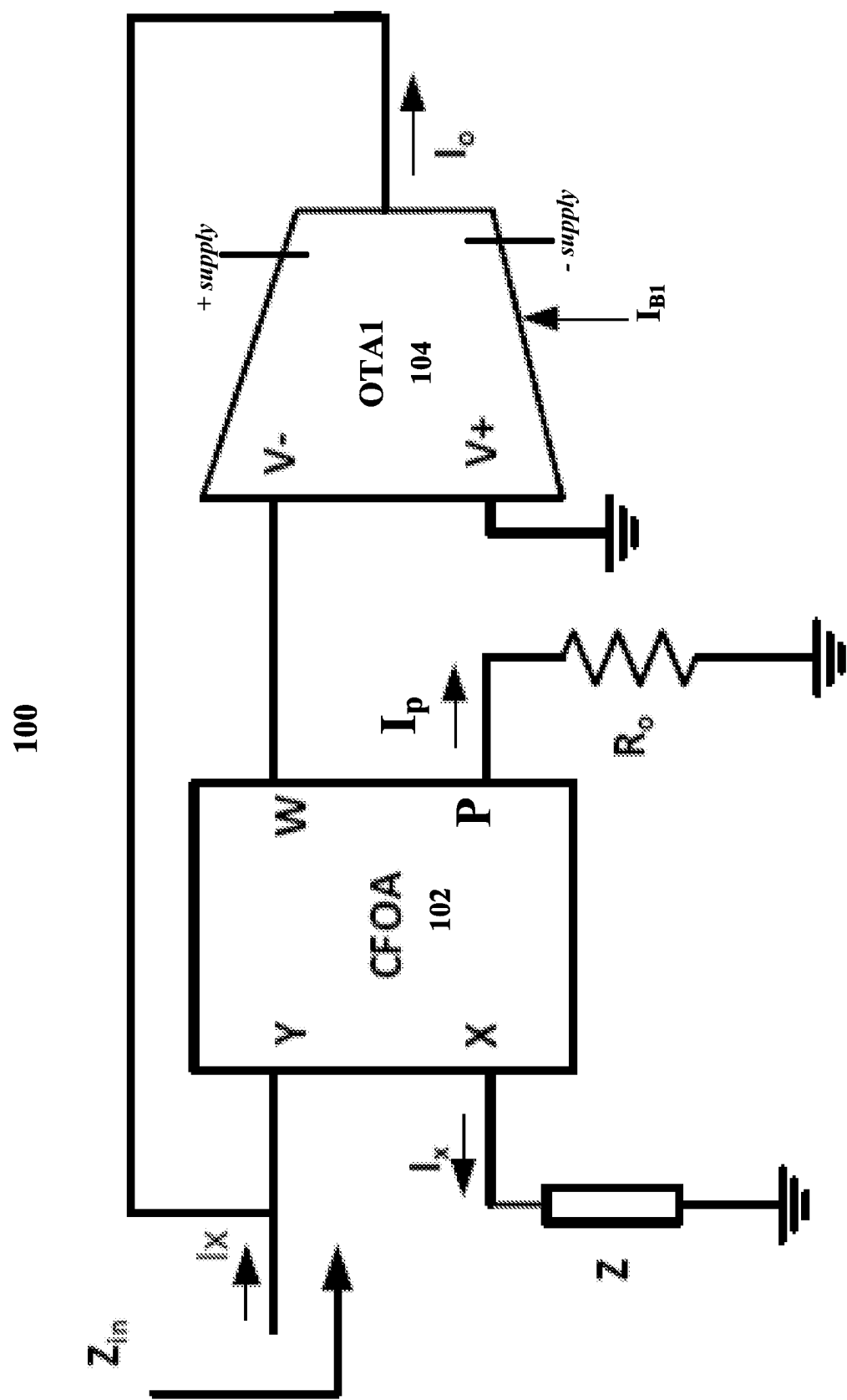
FIG. 1A illustrates a circuit diagram of the tunable grounded impedance multiplier.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "approximate," "about," and similar terms generally refer to ranges that include the identified value within a margin of 20%, 10%, or preferably 5%, and any values therebetween.

Aspects of this disclosure are directed to a tunable impedance multiplier and methods for tunably multiplying an impedance. In an aspect, the tunable impedance multiplier may include a low pass filter circuit. In another aspect, the tunable impedance multiplier may include a high pass filter circuit. In an aspect, the tunable impedance multiplier is modified to provide positive tunable impedance multiplication. In a further aspect, the tunable impedance multiplier is modified to provide negative tunable impedance multiplication A schematic of the tunable grounded positive and negative impedance multiplier 100 is shown in FIG. 1A. It includes a current feedback operational amplifier (CFOA) 102, an operational transconductance amplifier ($OTA_1$) 104, a grounded resistor $R_0$ and the impedance Z to be scaled.

Figure 1B:
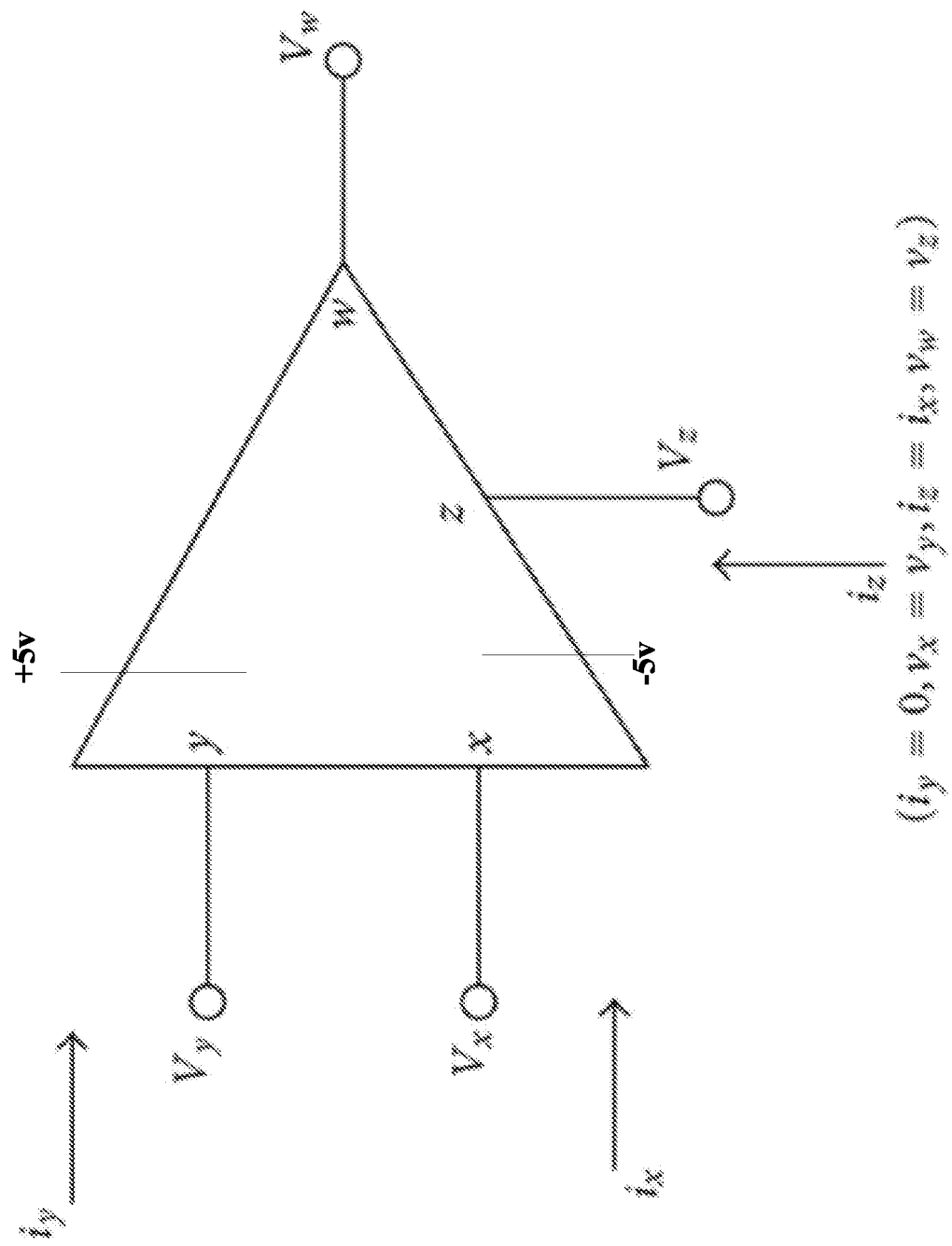
FIG. 1B illustrates the circuit connections of an OTA.

A schematic circuit showing a conventional CFOA is shown in FIG. 1B. For a CFOA, $I_y=0$, $V_x=V_y$, $I_z=I_x$, and $V_w=V_z$. (See Yuce, E, Minaei, S, Ibrahim, M. "A novel full-wave rectifier/sinusoidal frequency doubler topology based on CFOAs", Analog Integr Circ Sig Process, 2017) 93, pp. 351-362, incorporated herein by reference in its entirety). Note that in FIG. 1A, the symbol P has been used to represent the voltage due to the output resistance, rather than Z, to avoid confusion with the symbol Z which represents the impedance to be multiplied. The current through the resistor R0 has similarly been named $I_p$ for consistency. Supply voltages are shown as set at ±5v for explanatory purposes, but may be different depending on the amplifier specifications.

The operational transconductance amplifier (OTA) is an amplifier whose differential input voltage produces an output current. Thus, it is a voltage controlled current source (VCCS). In the ideal OTA, the output current is a linear function of the differential input voltage, calculated as follows: $I_{out}=(V_{in+}-V_{in-})\cdot g_m$. The gain, $g_m$, is directly proportional to the bias current, $I_B$, which provides the tuning capability of the impedance multiplier. The gain is indirectly proportional to the thermal voltage, $V_t$, which caused instability in previous multipliers.

Therefore, with reference to FIG. 1A, $$V_y=V_x=I_x \times Z \qquad (1)$$

$$V_w=V_p=I_p \times R_0 \qquad (2)$$

$$I_0=g_m(V^+-V^-) \qquad (3)$$

where $$g_m = \frac{I_B}{2V_t}$$

for a bipolar junction transistor (BJT) OTA, $V_y$ is the voltage at input Y of the CFOA 102, $V_x$ is the voltage at input X of the CFOA 102, $V_t$ is the thermal voltage=25 mV at room temperature. Combining equations (1)-(3) and noting that $I_x=-I_0$, since $I_y=$ and that $V^+=0$, the input impedance $Z_{in}$ can be expressed as:

$$Z_{in} = \frac{V_y}{I_x} = -\frac{V_y}{I_o} = \frac{V_y}{g_m(V^-)} = \frac{V_y}{g_m \times I_z R_o} = \frac{V_x}{g_m \times I_x R_o} = \frac{Z}{g_m \times R_o}$$

or simply:

$$Zin = \frac{Z}{gm \times R0}. \qquad (4)$$

With the transconductance of $OTA_1$ given by $g_m=20 \times I_{B1}$ (at room temperature, $V_t=25$ mV, therefore $g_m=I_{B1}/2V_t=20I_{B1}$), equation (4) can be rewritten as:

$$Zin = \frac{Z}{20 \times IB1 \times R0}. \qquad (5)$$

If the impedance Z, is replaced by a capacitor C, then equation (5) implements a capacitance multiplier whose value is tunable by the OTA bias current and is given by:

$$C_{eq}=(20 \times I_{B1} \times R_o)C. \qquad (6)$$

If the impedance Z is replaced by a resistor R, then equation (5) implements a resistance multiplier whose value is tunable by the $OTA_1$ bias current and is given by:

$$Req = \frac{R}{20 \times IB1 \times R0}. \qquad (7)$$

A. Simulation Results

To verify the functionality of the impedance multiplier of the present disclosure, the capacitance and resistance multipliers obtained from FIG. 1B were used to design a low pass filter (LPF) and a high pass filter (HPF) as shown in FIG. 2A, 2B, 2C, 2D. The functionality of the circuits of FIG. 2B, 2D was confirmed using a PSPICE simulation program.

Figure 2A:
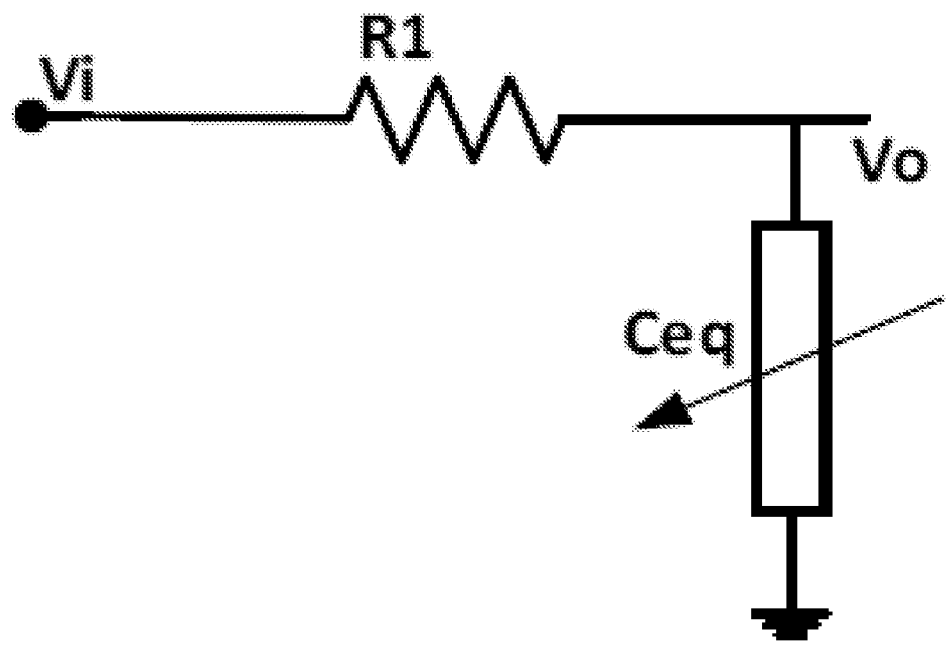
FIG. 2A illustrates a low pass filter using capacitive impedance.
Figure 2B:
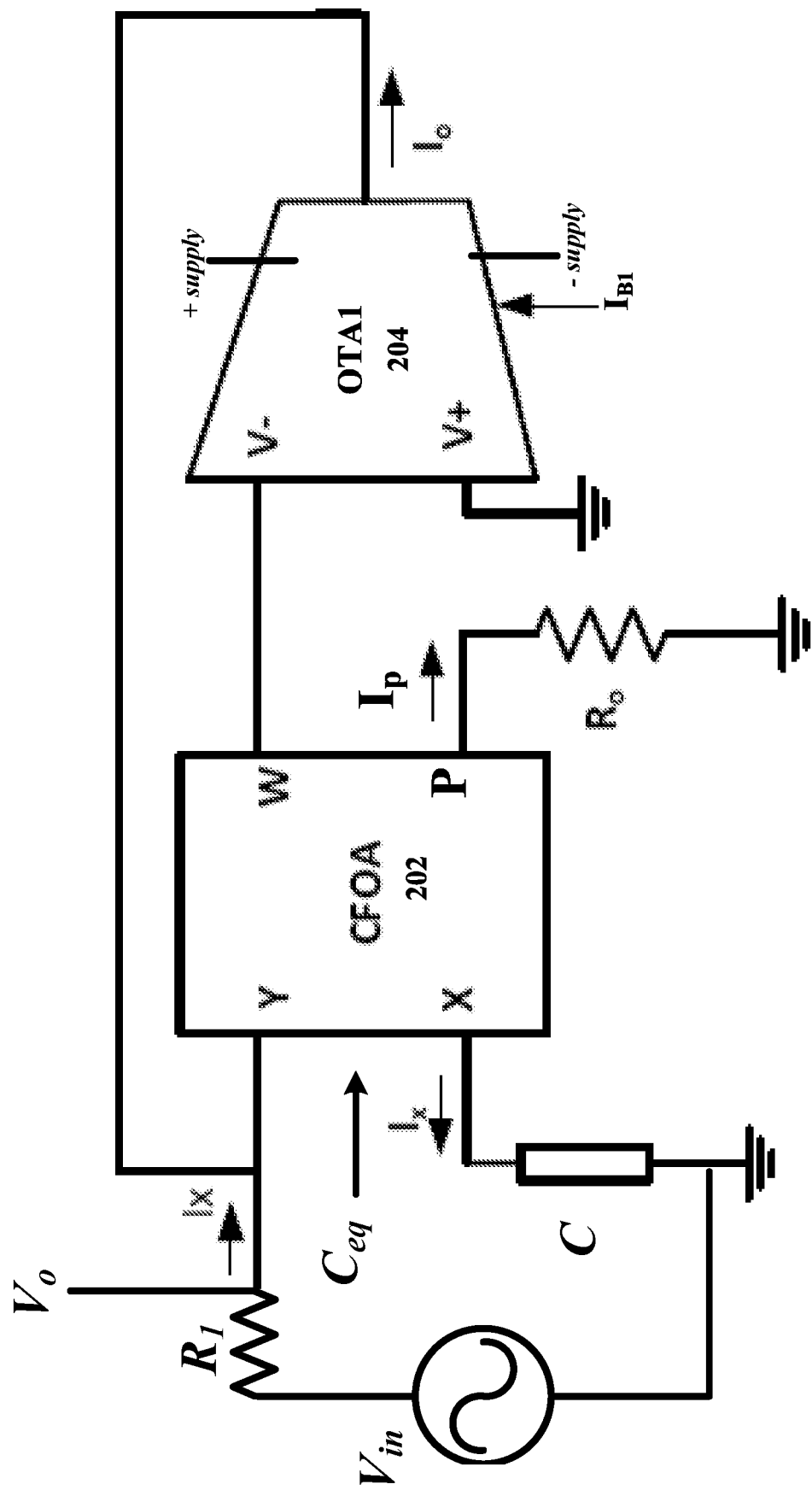
FIG. 2B illustrates a low pass filter circuit using the equivalent capacitance circuit.
Figure 3:
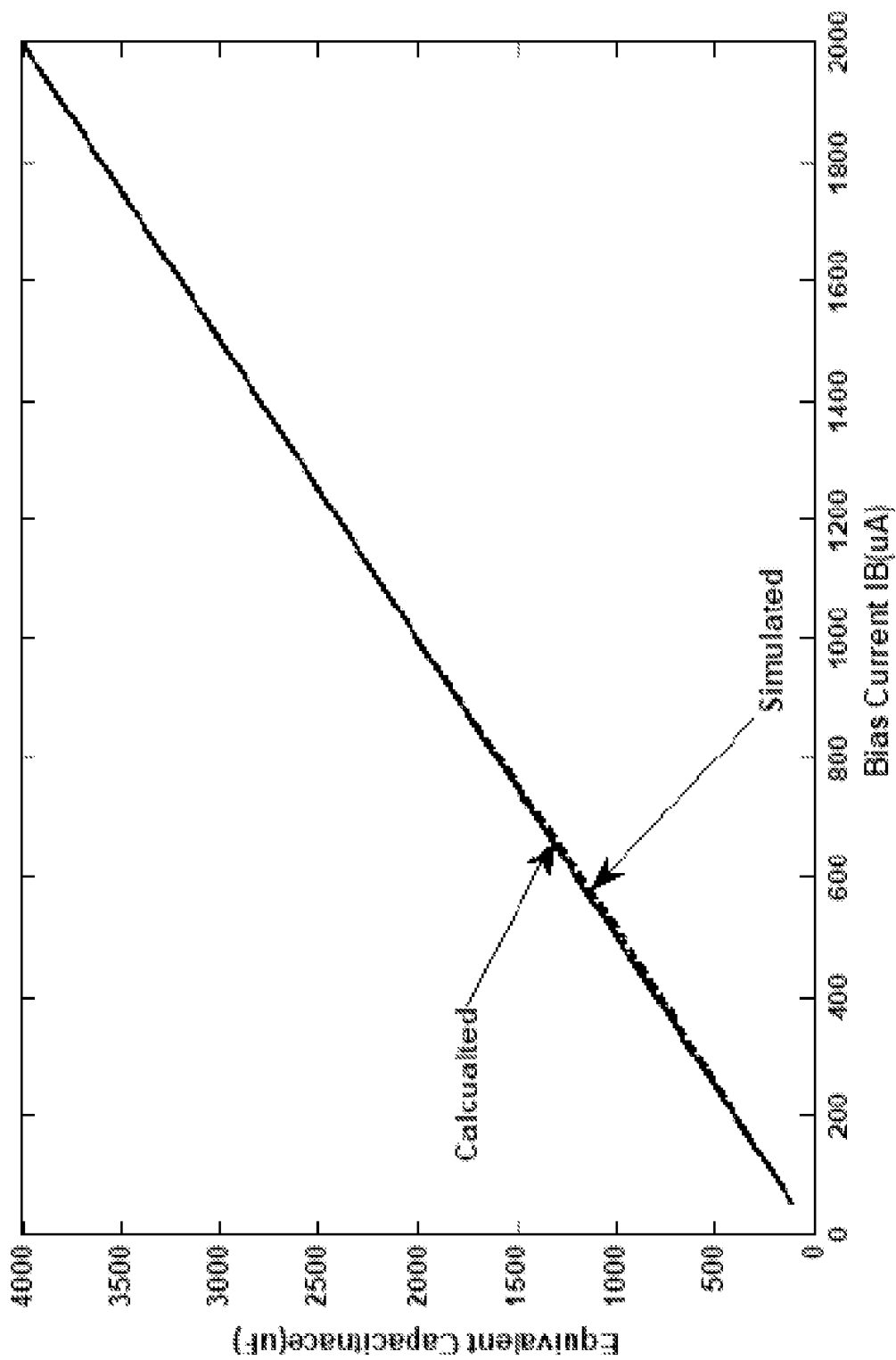
FIG. 3 is a plot of the simulated and calculated capacitances versus the bias current $I_B$.

The capacitance circuit of FIG. 2A was used in a low pass filter circuit as shown in more detail in FIG. 2B. In a non-limiting example, the circuit was designed with $R_0 = R_1 = 1$ k$\Omega$, C=100 nF, and commercially available integrated circuits AD844 (CFOA), LM13700N (OTA) were used. The amplifier bias supplies were connected to a ±5V power supply. The bias current $I_{B1}$ was swept from 50 uA to 2000 uA (2000 uA is the maximum bias current of the OTA). The −3 dB frequency was measured, from which the value of the equivalent capacitance was calculated, as the −3 dB frequency equals the cutoff frequency, 1/RC. Plots of the simulated and calculated capacitances are shown in FIG. 3. It is evident from FIG. 3 that the calculated and simulated results are in close agreement for $I_B \leq 2000$ uA.

Figure 4:
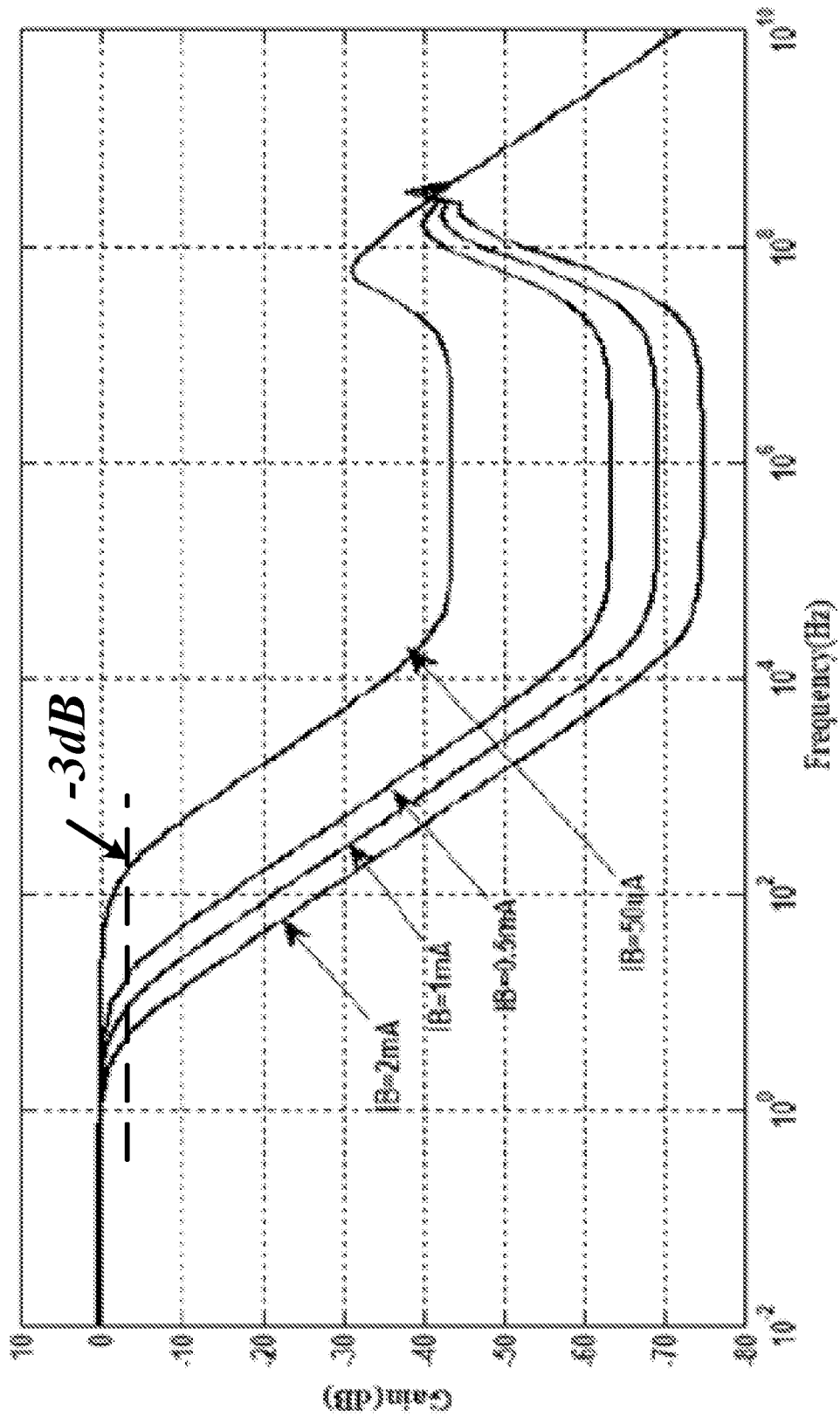
FIG. 4 is a graph illustrating the frequency response for the low pass filter with tunable cut-off frequency.

Frequency response simulation for the low pass filter was also carried out. The cut-off frequency was tuned using the bias current $I_B$. The results obtained are shown in FIG. 4 as a function of four values of the bias current $I_B$, which are $I_B = 50$ micro amps, 0.5 mA, 1 mA, and 2 mA.

Figure 5:
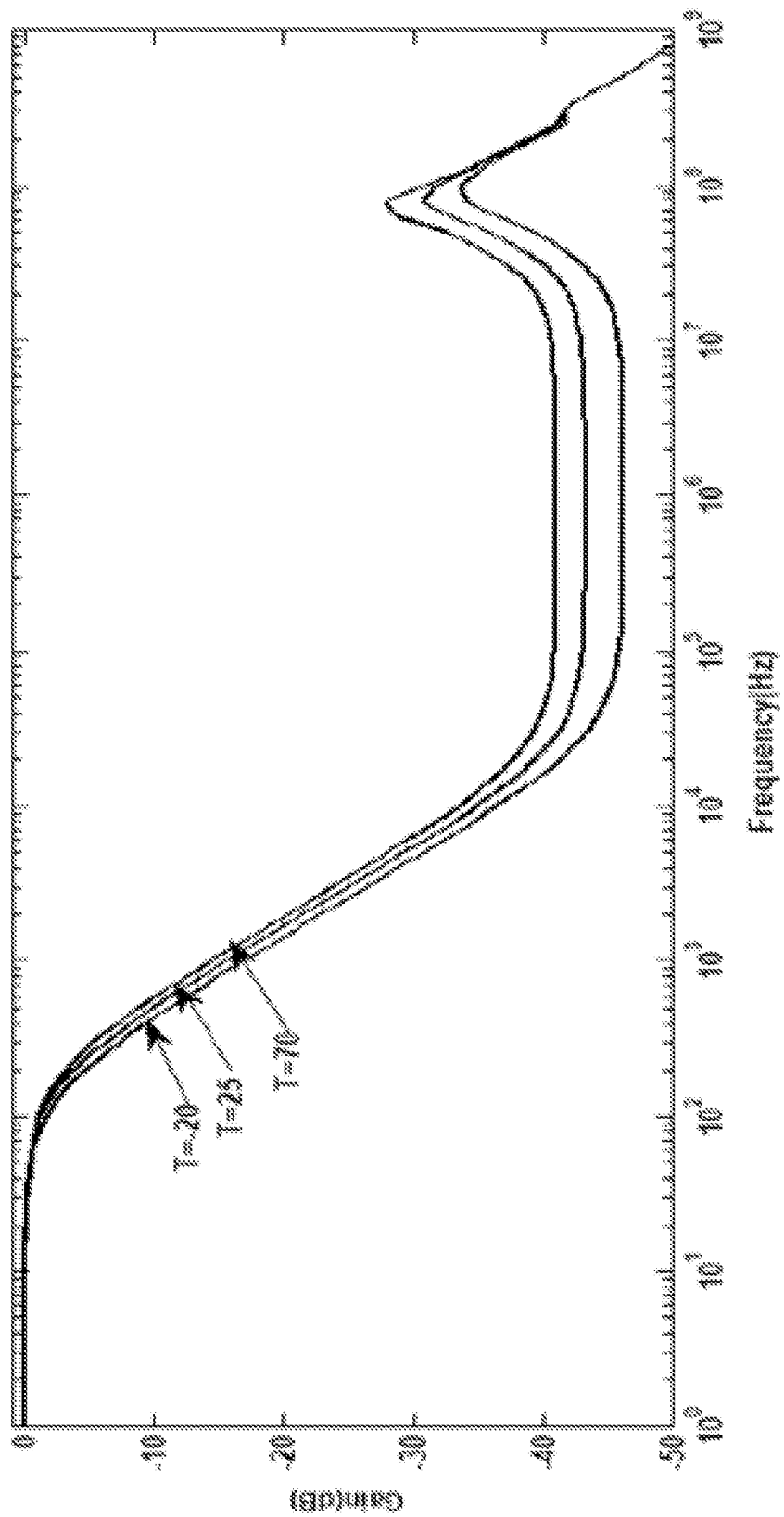
FIG. 5 is a graph illustrating the simulation of the temperature effect when $I_B$=1000 μA.

Since the operation of the circuit of FIG. 1A is dependent on $g_m$, which is a function of temperature, it is important to examine the effect of temperature variation on the performance of the circuits of FIG. 1A, 2A-2B. The simulation results obtained from FIG. 2A and shown in FIG. 5 indicate that the cut-off frequency only slightly changes with temperature.

Figure 2C:
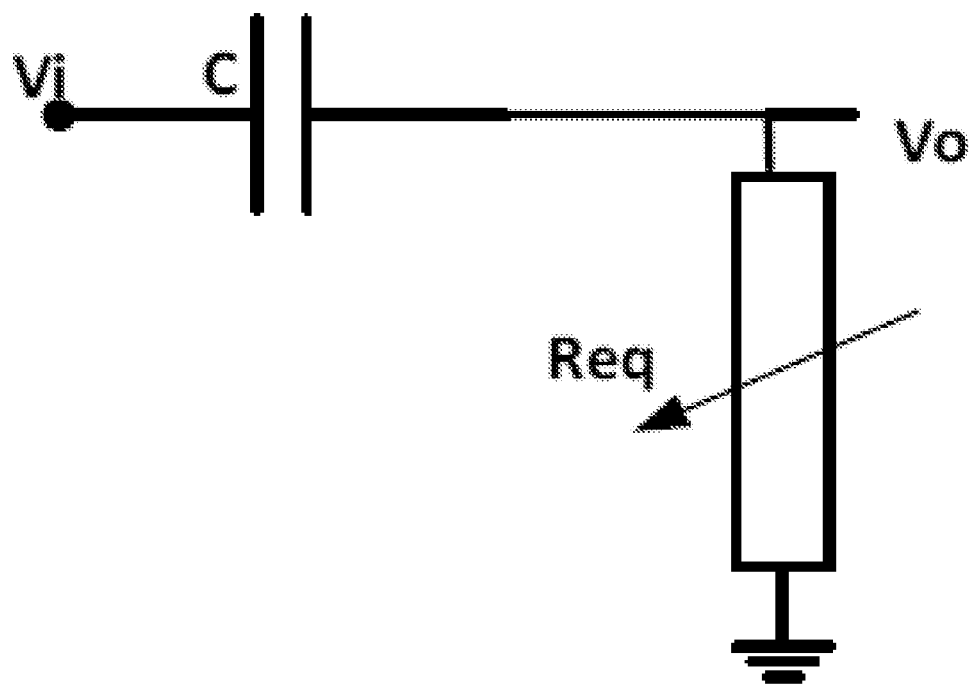
FIG. 2C illustrates a high pass filter using resistive impedance.
Figure 2D:
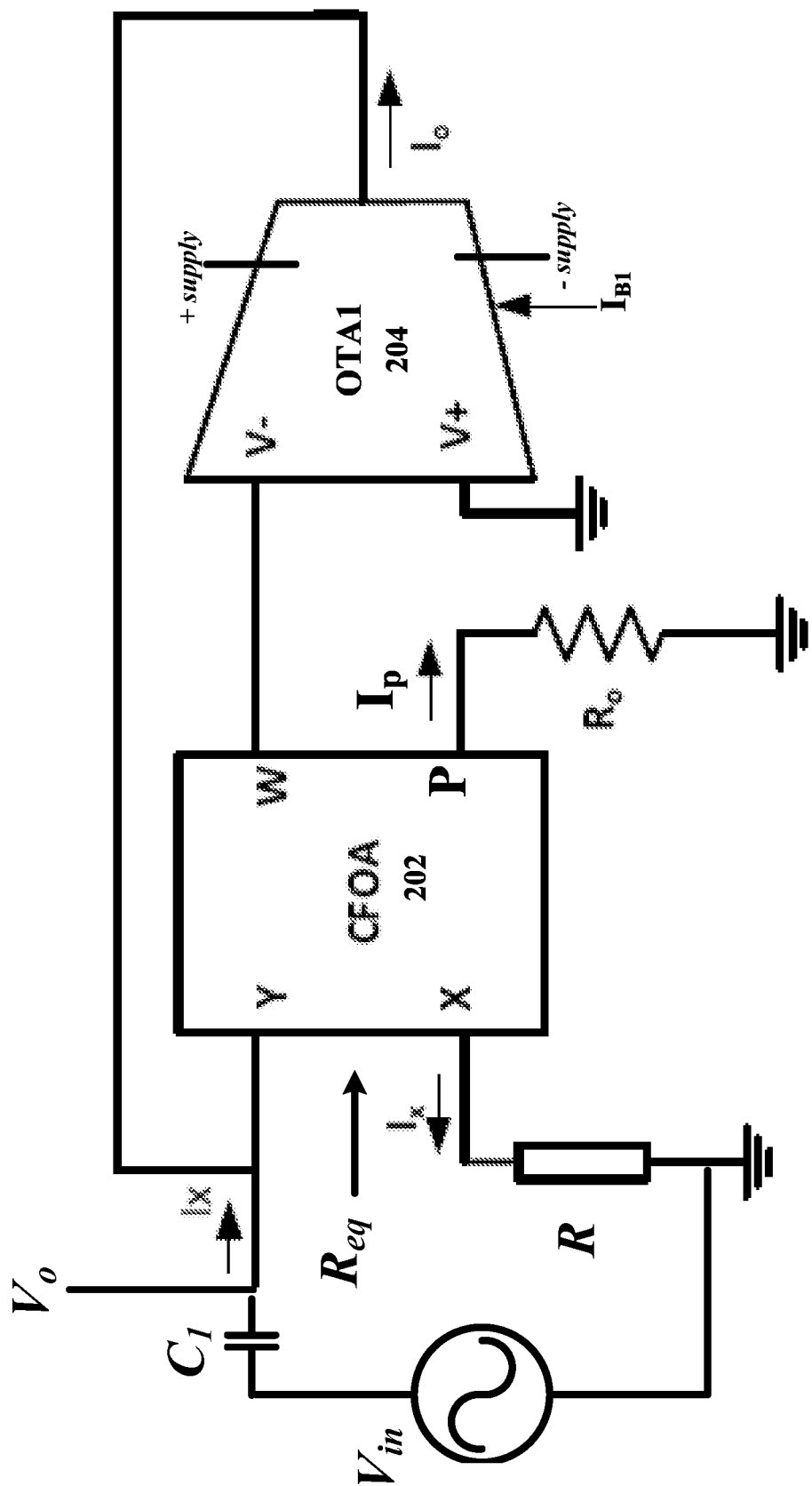
FIG. 2D illustrates a high pass filter circuit using the equivalent resistance circuit.
Figure 6:
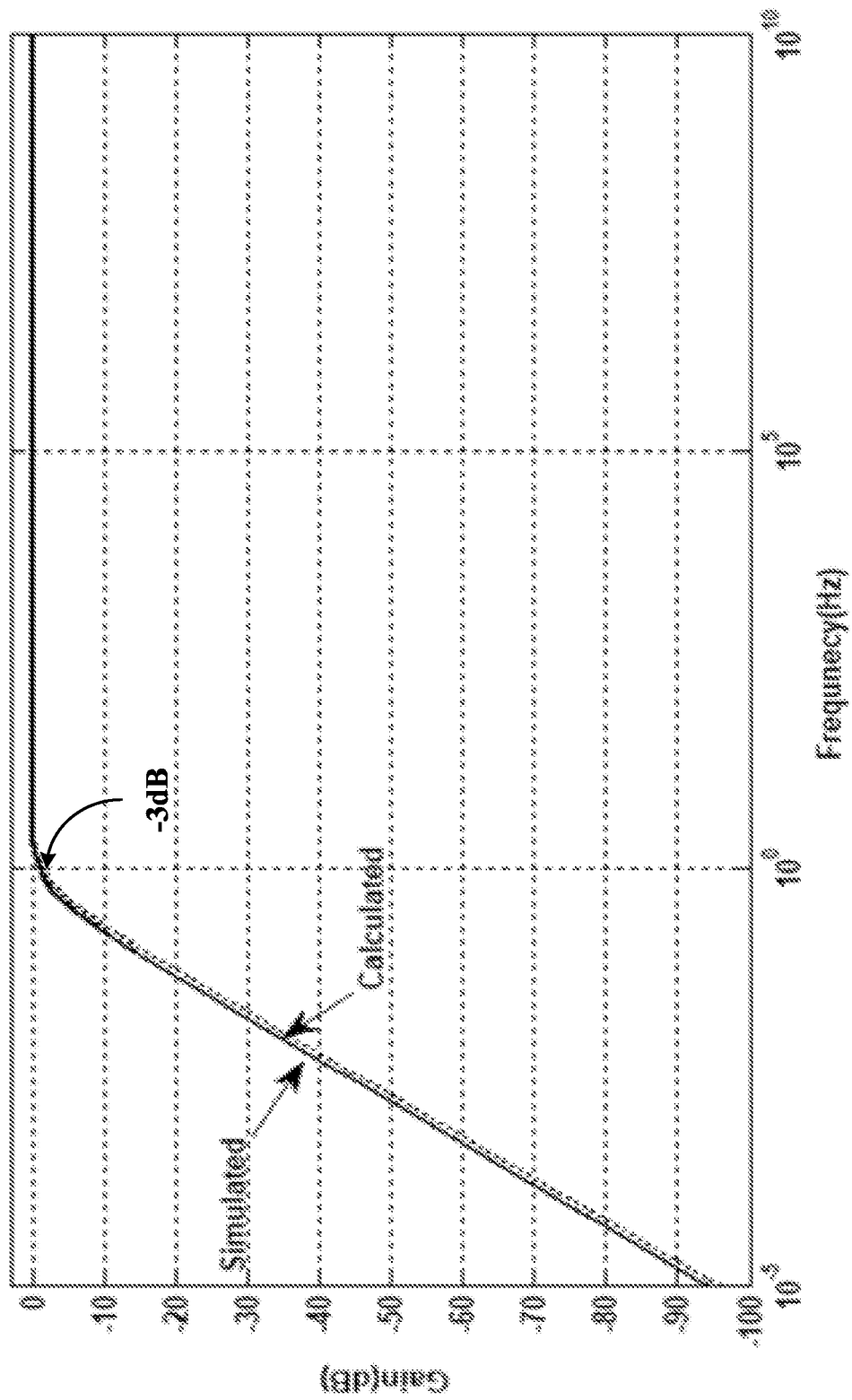
FIG. 6 is a graph illustrating the frequency response for the high pass filter using ideal and simulated resistors.

The high pass filter circuit of FIG. 2C is shown in more detail in FIG. 2D. In a non-limiting example, the circuit was simulated with C=100 nF, Z=10 k$\Omega$ and $R_0$=10$\Omega$. The amplifier bias supplies were connected to a ±5V power supply. The bias current was set to 5 μA. Referring to the frequency response shown in FIG. 6, it is clear that the −3 dB point is at 0.6 Hz. This frequency at the −3 dB point=1/RC. Since the capacitor value is known, the resistor was determined to be a resistance of 2.5 M$\Omega$. This means that the resistor Z was scaled (multiplied) by 250 times.

Figure 7:
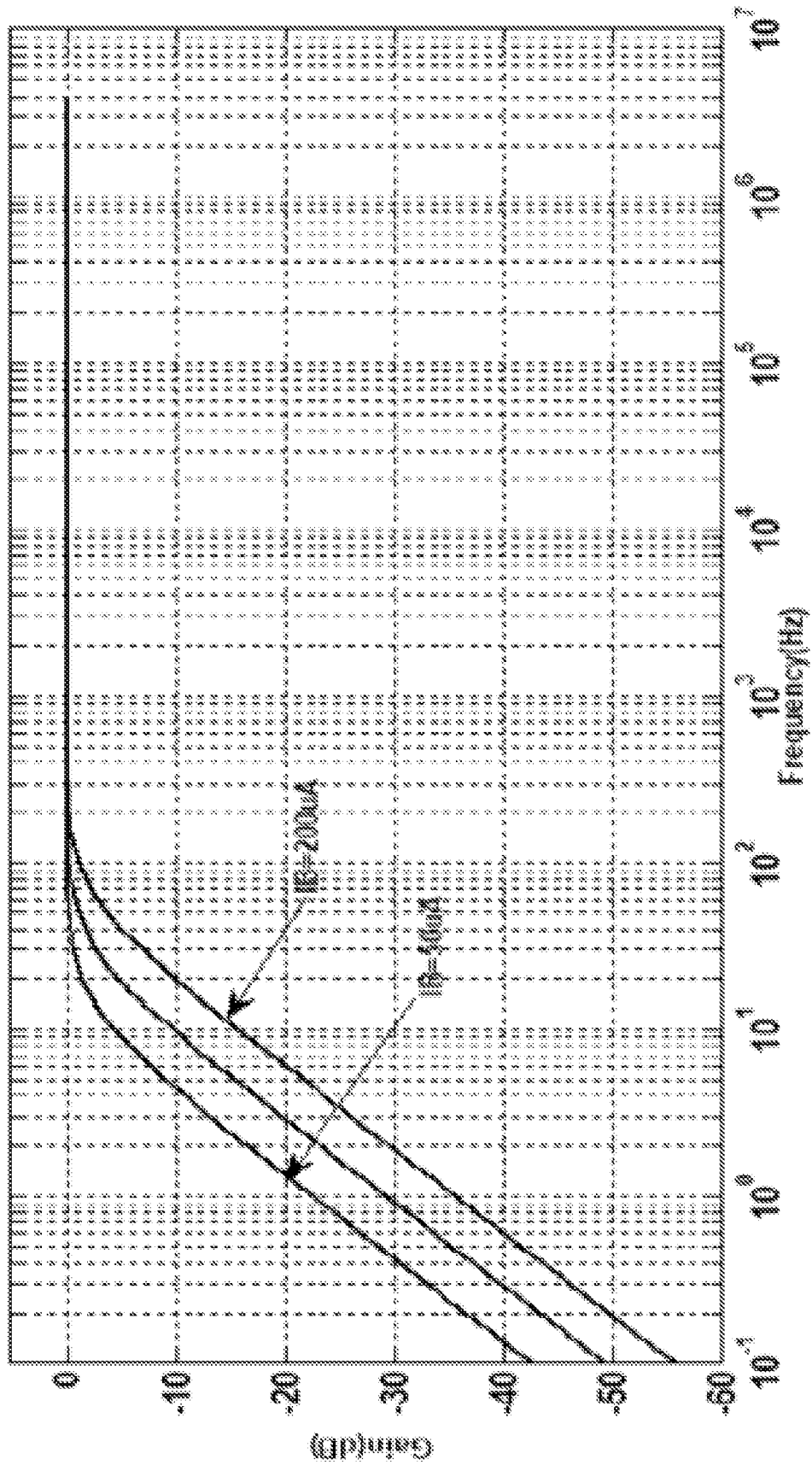
FIG. 7 is a graph illustrating the frequency response for the high pass filter using a simulated resistor.

In a non-limiting example which illustrates the tunability of the resistor, the capacitor was set to 10 nF and the bias current, $I_B$, was varied from 50 μA to 200 μA. The response of the high pass filter is shown in FIG. 7. It is clear from FIG. 7 that the cut-off frequency varies with the bias current.

B. Experimental Results

Experimental verification was carried out using the high pass filter circuit with C=10 nF, and Z=10k$\Omega$ and the bias current was varied from 50 μA to 200 μA. A plot of the experimental results is shown in FIG. 8.

Figure 8:
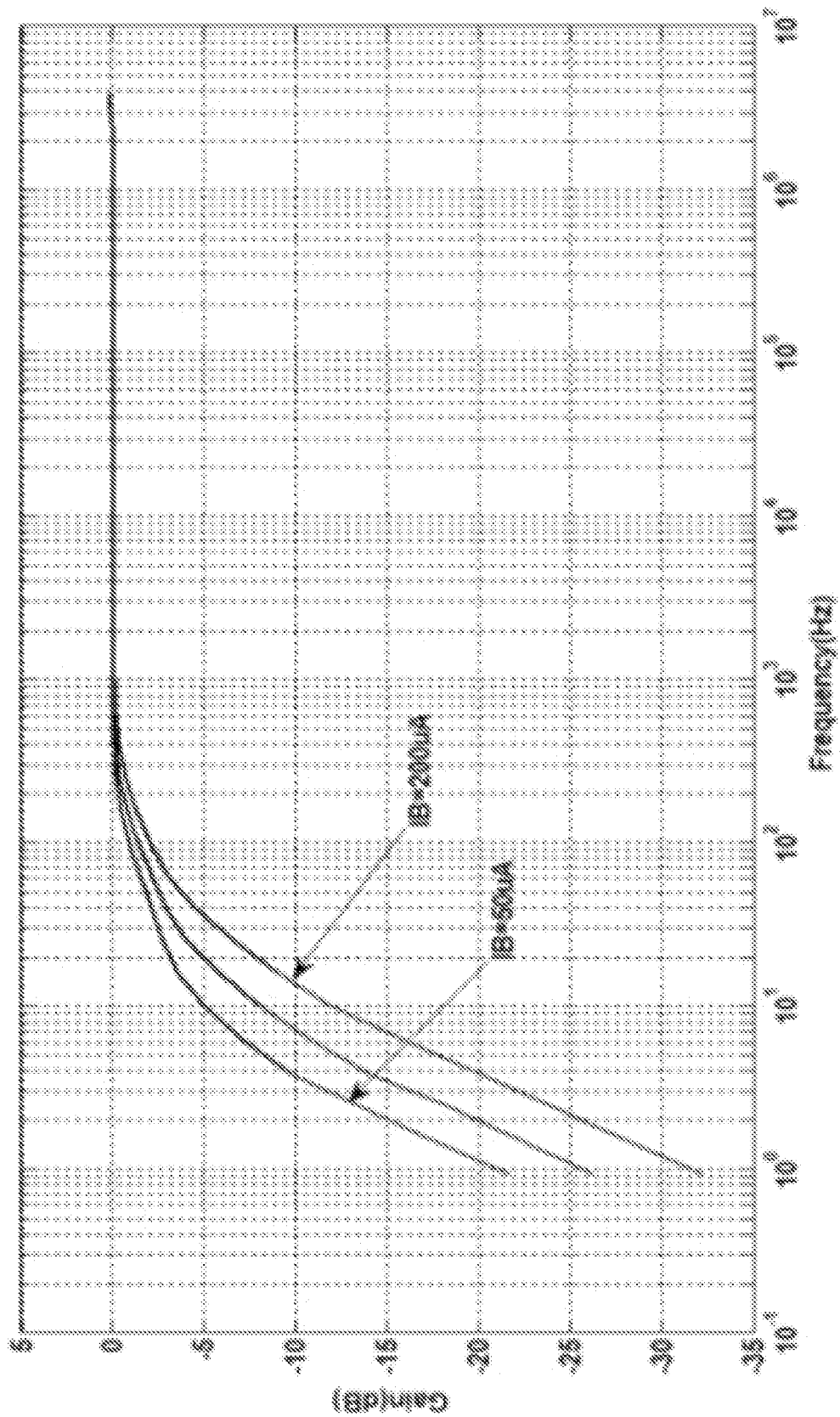
FIG. 8 is a graph illustrating the experimental results obtained for a high pass filter (FIG. 2b) using the resistance multiplier.

It is clear from FIG. 8 that the experimental results are in excellent agreement with the simulation shown in FIG. 7.

Figure 9:
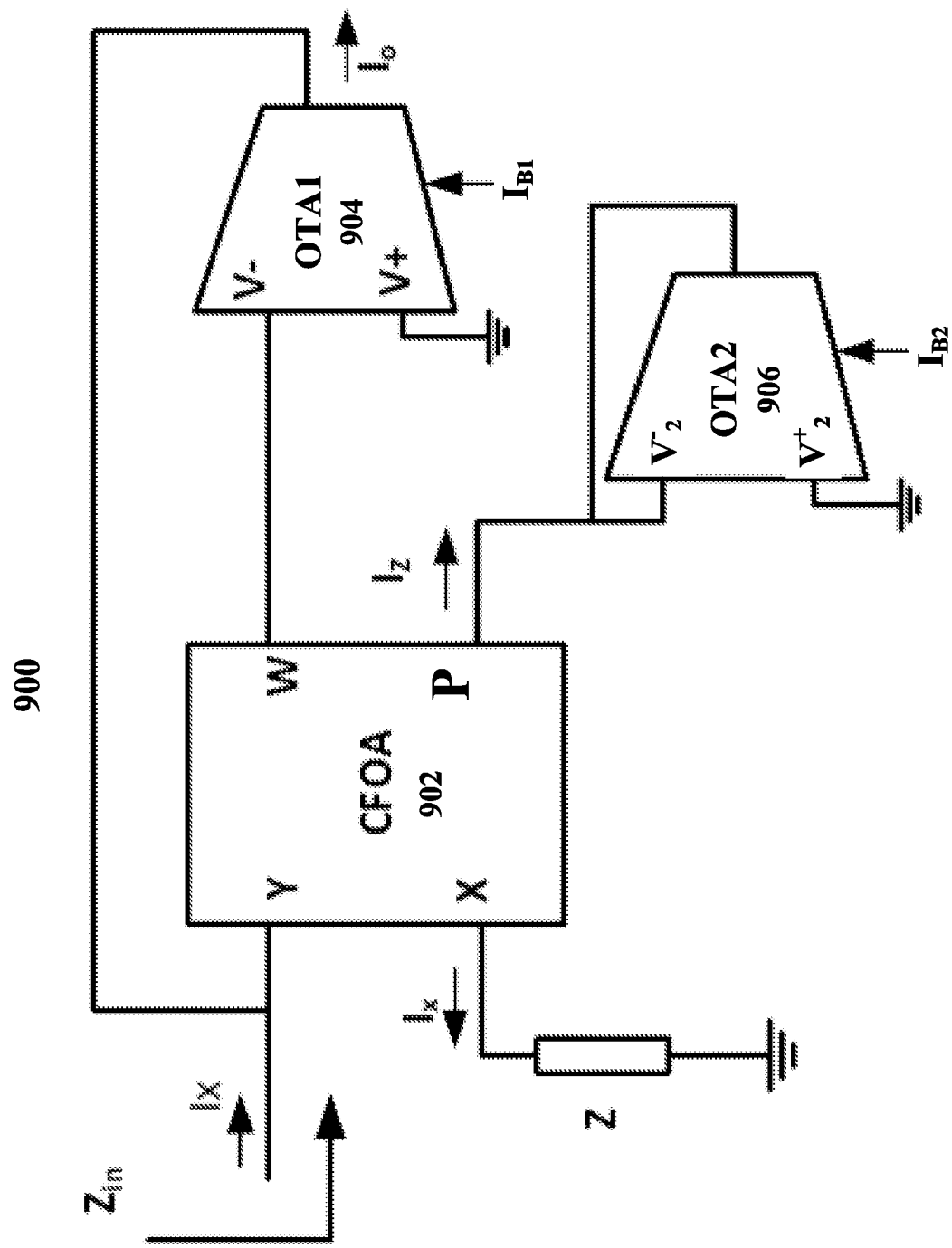
FIG. 9 illustrates the resistor-less positive impedance multiplier.

In order to minimize the temperature dependence, the circuit in FIG. 1A was modified as shown in FIG. 9 by replacing the resistance $R_o$ with an operational transconductance amplifier OTA$_2$ 106.

With reference to FIG. 9, OTA$_2$ 106 is configured as a resistor equal to $1/g_{m2}$. Thus, equation (4) can be rewritten as:

$$Zin = Z\frac{IB2}{IB1}. \qquad (8)$$

where $I_{B1}$ and $I_{B2}$ are the bias currents for OTA1 and OTA2 respectively.

It is clear from equation (8), that the impedance can be scaled up or down using the bias currents $I_{B1}$ and $I_{B2}$. Moreover, it is free of passive components and it is temperature insensitive.

Figure 10:
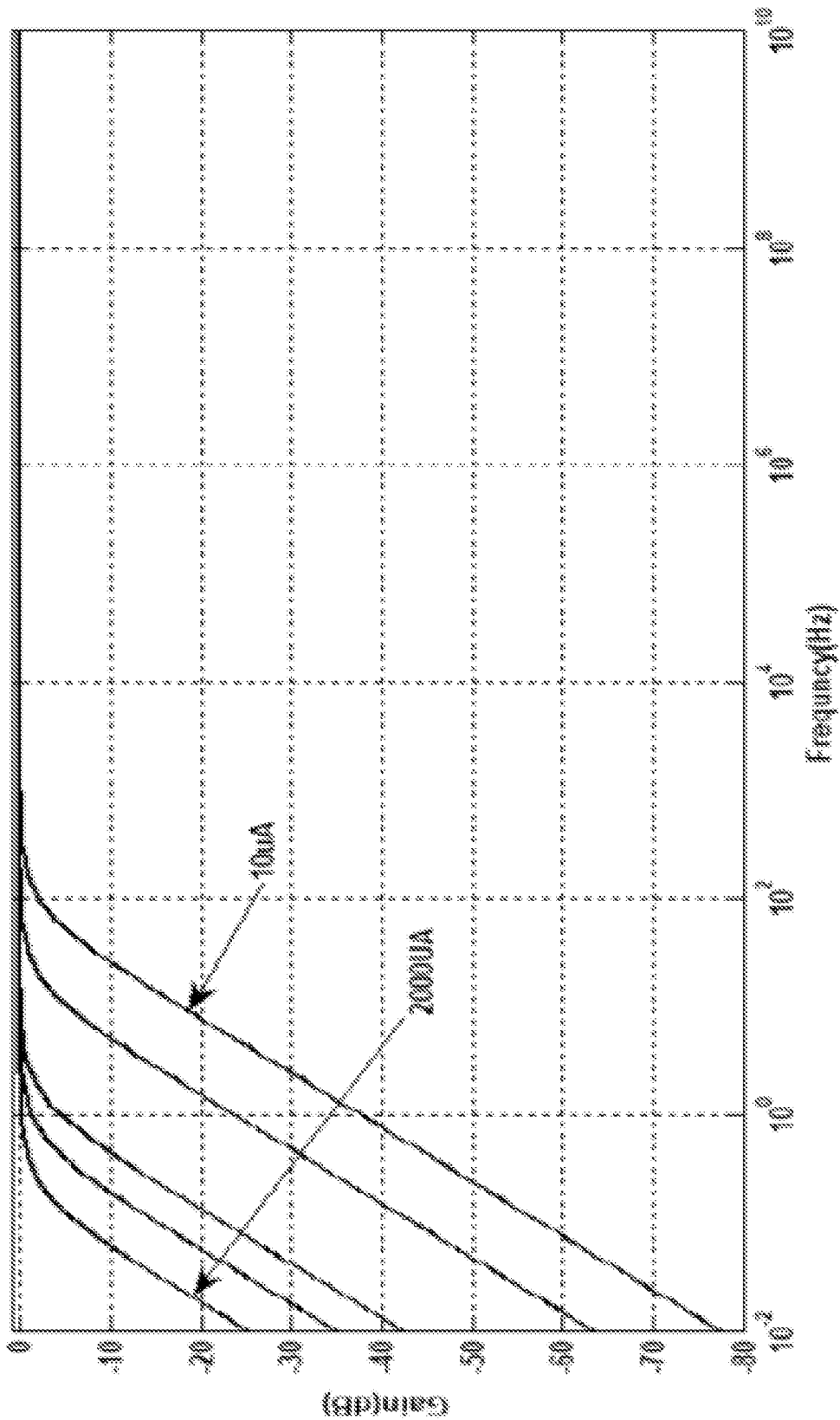
FIG. 10 is a graph illustrating the simulation results for a high pass filter using the positive impedance multiplier of FIG. 9.

In a non-limiting example, the modified design was simulated as a resistance multiplier in a high pass filter. The bias current $I_{B1}$ was fixed to 10 μA and $I_{B2}$ was varied from 50 μA to 2000 μA, Z=10k$\Omega$ and C=100 nF. The simulation results shown in FIG. 10 confirm the functionality of the design.

Figure 11:
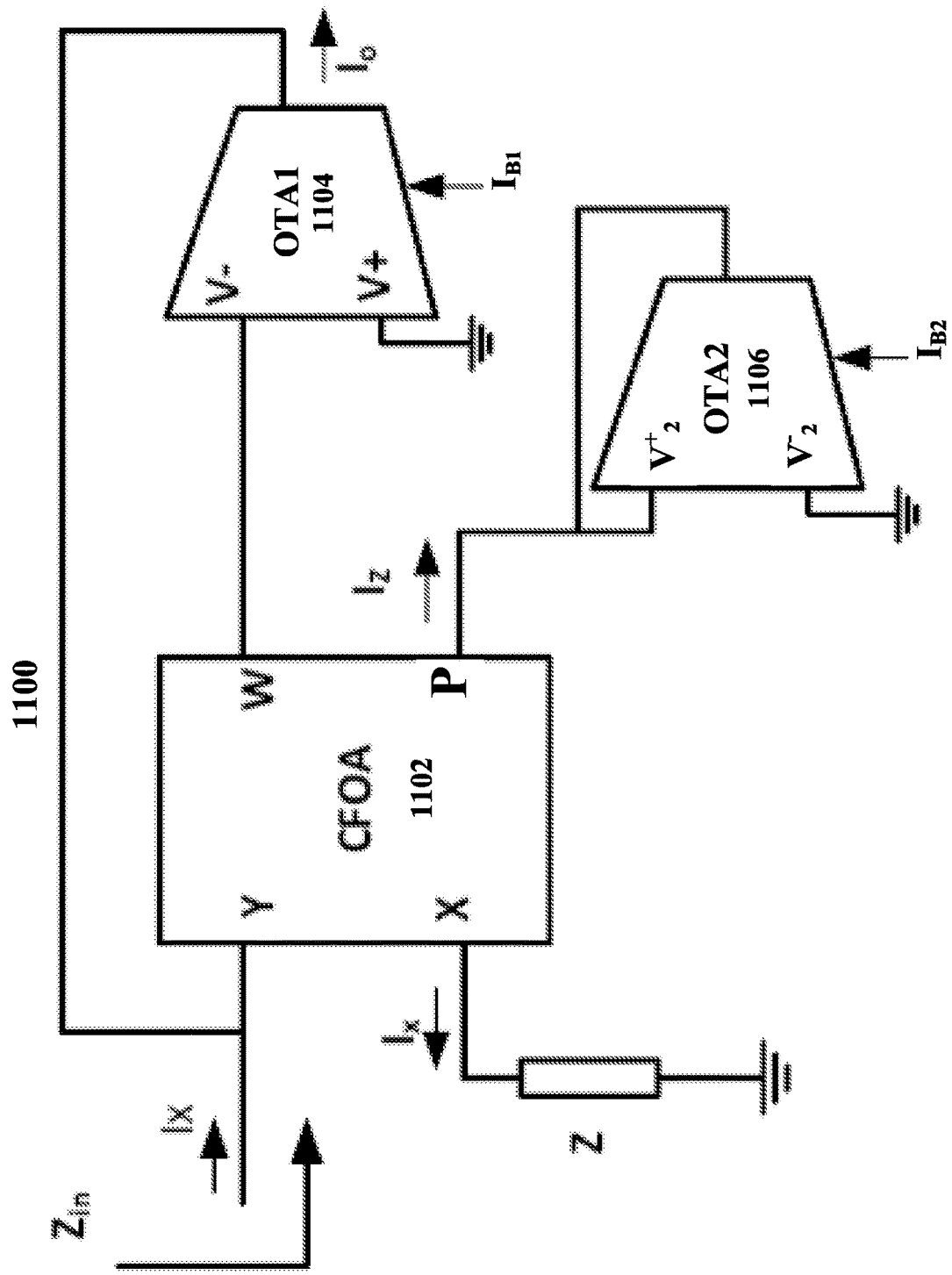
FIG. 11 illustrates a block diagram for a negative impedance multiplier.

The circuit of the present disclosure provides tunable positive (as shown above) and negative impedance multiplication. A tunable negative impedance multiplier can be achieved if OTA2 is configured as a negative resistor as shown in FIG. 11. The equivalent impedance $Z_{in}$ is given by:

$$Z_{in} = -Z\frac{I_{B1}}{I_{B2}} \qquad (9)$$

The first embodiment is described with respect to FIGS. 1A, 2B, 2D, 9 and 11. The first embodiment is a tunable impedance multiplier, comprising a current feedback operational amplifier, CFOA 102, having a current input Y, a current input X, a voltage output W and a voltage output P; a first operational transconductance amplifier, OTA$_1$ 104, having a gain $g_m$, a first positive voltage input V+, a first negative voltage input V−, a first bias current input $I_{B1}$, a positive supply voltage, a negative supply voltage, and a current output $I_o$. A resistor $R_0$ is connected to the voltage output P at a first end and is connected to ground at a second end. An impedance, Z, is connected to the input X at a first end and is connected to ground at a second end. The voltage output, W, is connected to the voltage input, V, of OTA$_1$ and the current output, $I_o$, is connected as feedback to the current input Y of the CFOA.

The impedance Z may be either a resistor or a capacitor. The equivalent input impedance, $Z_{in}$, of the impedance multiplier is given by the equation $$Zin = \frac{Z}{gm \times R0}.$$

If $g_m = 20 \times I_{B1}$, the equivalent input impedance, $Z_{in}$, of the impedance multiplier is given by the equation $$Zin = \frac{Z}{20 \times IB1 \times R0}.$$

If the impedance Z is a capacitor, C, and $g_m = 20 \times I_{B1}$ the equivalent capacitance of the impedance multiplier is given by $C_{eq} = (20 \times I_{B1} \times R_0)C$.

If the impedance Z is a resistor, $g_m = 20 \times I_{B1}$ and the equivalent resistance of the impedance multiplier is given by $$Req = \frac{Z}{20 \times IB1 \times R0}.$$

FIG. 9 illustrates a positive impedance multiplier which is temperature insensitive in which the resistor $R_o$ is provided by a second operational transconductance amplifier, OTA$_2$ 906, where the second operational transconductance amplifier includes an inverting voltage input, $V_2^-$, a non-inverting voltage input, V2+, a bias input, $I_{B2}$, a second positive and a second negative supply voltage, and a second current output which is connected to the inverting voltage input, wherein the inverting voltage input is connected to the voltage output P and the non-inverting voltage input is connected to ground.

In FIG. 9, the impedance Z may be a resistor or a capacitor and the equivalent input impedance, $Z_{in}$, of the impedance multiplier is given by the equation $$Zin = Z\frac{IB2}{IB1}.$$

FIG. 11 illustrates a negative impedance multiplier which is temperature insensitive in which the resistor $R_O$ is provided by a second operational transconductance amplifier, $OTA_2$, where the second operational transconductance amplifier includes an inverting voltage input, a non-inverting voltage input, a bias input, $I_{B2}$, a second positive and a second negative supply voltage, and a second current output which is connected to the inverting voltage input, wherein the non-inverting input is connected to the voltage output P and the inverting input is connected to ground. In FIG. 11, the impedance Z is a resistor or a capacitor and the equivalent input impedance, $Z_{in}$, of the impedance multiplier is given by the equation $$Zin = -Z\frac{IB2}{IB1}.$$

Referring back to FIG. 2A, the impedance multiplier can include a low pass filter circuit having a resistor, $R_1$, connected at a first end to the current input Y; a voltage output, $V_O$, connected to the first end; wherein a first end of an alternating voltage source, $V_{in}$, is connected to a second end of the resistor, R1; and a second end of the alternating voltage source, $V_{in}$, is connected to ground.

Additionally, the resistance $R_O$ may be provided by a second operational transconductance amplifier, $OTA_2$, as shown with respect to FIG. 9, where the second operational transconductance amplifier includes an inverting voltage input, a non-inverting voltage input, a bias input, $I_{B2}$, a second positive and a second negative supply voltage, and a second current output which is connected to the inverting voltage input, wherein the inverting voltage input is connected to the voltage output P and the non-inverting voltage input is connected to ground.

Alternatively, the resistance $R_O$ may be provided by a second operational transconductance amplifier, $OTA_2$, as shown with respect to FIG. 11, where the second operational transconductance amplifier includes an inverting voltage input, a non-inverting voltage input, a bias input, $I_{B2}$, a second positive and a second negative supply voltage, and a second current output which is connected to the inverting voltage input, wherein the non-inverting input is connected to the voltage output P and the inverting input is connected to ground. The circuit of FIG. 11 provides temperature insensitivity, thus greater stability. The equivalent impedance for this circuit is positive.

The tunable impedance multiplier may further comprise a high pass filter circuit shown in FIG. 2D, including a capacitor, $C_1$, connected at a first end to the current input Y; a voltage output, $V_o$, connected to the first end of the capacitor; a first end of an alternating voltage source, $V_{in}$, connected to a second end of the capacitor, C1 and a second end of an alternating voltage source, $V_{in}$, connected to ground.

The tunable impedance multiplier having a high pass filter circuit as shown in FIG. 2D may have the resistor $R_O$ provided by a second operational transconductance amplifier, $OTA_2$ as shown in FIG. 11, where the second operational transconductance amplifier includes an inverting voltage input, a non-inverting voltage input, a bias input, $I_{B2}$, a second positive and a second negative supply voltage, and a second current output which is connected to the inverting voltage input, wherein the inverting voltage input is connected to the voltage output P and the non-inverting voltage input is connected to ground. This circuit configuration provides high pass filtering and positive impedance multiplication.

Alternately, $R_O$ may provided by a second operational transconductance amplifier, $OTA_2$, as shown in FIG. 11, where the second operational transconductance amplifier includes an inverting voltage input, a non-inverting voltage input, a bias input, $I_{B2}$, a second positive and a second negative supply voltage, and a second current output which is connected to the inverting voltage input, wherein the non-inverting input is connected to the voltage output P and the inverting input is connected to ground. This circuit configuration provides high pass filtering and negative impedance multiplication.

The second embodiment is illustrated with respect to FIGS. 1A, 2B, 2D, 9 and 11.

Referring to FIG. 1A, the second embodiment describes a method for tunably multiplying an impedance, comprising connecting an alternating current source, $i_x$, to a first current input, Y, of a current feedback operational amplifier, CFOA 102; connecting a second current input X of the CFOA to an impedance, Z; connecting a first output, W, of the CFOA to an inverting input, $V^-$, of a first operational transconductance amplifier, $OTA_1$ 104 having a specified gain, $g_m$; connecting a second output, P, of the CFOA to a grounded resistance, $R_O$; connecting a non-inverting input, $V^+$, of the $OTA_1$ to ground; connecting a current output, $I_O$, of the $OTA_1$ to the first current input of the CFOA. Tuning and determining the output comprises sweeping the amplitude of a first bias current source, $i_{B1}$, connected to a bias input of the $OTA_1$ over a range of frequencies of alternating current $i_x$; determining the −3 dB points of the current output corresponding to the range of frequencies and calculating the equivalent input impedance based on the equation $$Zin = \frac{Z}{gm \times R0}.$$

Referring to FIG. 9, the method includes providing temperature insensitivity and positive impedance multiplication by providing the grounded resistance, $R_o$, by connecting an inverting input of a second operational transconductance amplifier, $OTA_2$ 106 to a second voltage output, P, of the CFOA, connecting the non-inverting input of the $OTA_2$ to ground and connecting the output of the $OTA_2$ to the inverting input of the $OTA_2$. Tuning and determining the output comprises connecting a second bias current source, $i_{B2}$, to a bias input of the $OTA_2$; sweeping the amplitudes of the first bias current source, $i_{B1}$, of the $OTA_1$ and second bias current source, $i_{B2}$, of the $OTA_2$ over a range of frequencies of alternating current $i_x$, wherein the value of the impedance, Z, is positive and multiplied by the factor $$\frac{IB2}{IB1}.$$

Alternatively, referring to FIG. 11, the method includes providing temperature insensitivity and negative impedance multiplication by providing the grounded resistance, $R_o$, by connecting a non-inverting input of a second operational transconductance amplifier, $OTA_2$ to a second voltage output of the CFOA, connecting the inverting input of the $OTA_2$ to ground and connecting the output of the $OTA_2$ to the inverting input of the $OTA_2$; connecting a second bias current source, $i_{B2}$, to a bias input of the $OTA_2$; sweeping the amplitudes of the first bias current source, $i_{B1}$, of the $OTA_1$ and second bias current source, $i_{B2}$, of the $OTA_2$ over a range of frequencies of alternating current $i_x$, wherein the value of the impedance, Z, is negative and multiplied by the factor $$\frac{IB2}{IB1}.$$

The third embodiment is described with respect to FIGS. 1A, 2B, 2D, 9 and 11. The third embodiment describes a method for tunably multiplying an impedance, comprising connecting an alternating current source, $i_x$, to a first current input, Y, of a current feedback operational amplifier, CFOA 102; connecting a second current input, X, of the CFOA to an impedance, Z; connecting a first output, W, of the CFOA to an inverting input, $V^-$, of a first operational transconductance amplifier, $OTA_1$ having a specified gain, $g_m$; connecting a non-inverting input, $V^+$, of the $OTA_1$ to ground; connecting a current output of the $OTA_1$ to the first current input of the CFOA; connecting an inverting input, $V_2^-$, of a second operational transconductance amplifier $OTA_2$ 106 to a second voltage output, P, of the CFOA, connecting the non-inverting input, $V_2^+$ of the $OTA_2$ to ground and connecting the output of the $OTA_2$ to the inverting input of the $OTA_2$; connecting a second bias current source, $i_{B2}$, to a bias input of the $OTA_2$. Tuning and determining the output comprises sweeping the amplitudes of the first bias current source, $i_{B1}$, of the $OTA_1$ and second bias current source, $i_{B2}$, of the $OTA_2$ over a range of frequencies of alternating current $i_x$, determining the −3 dB points of the current output corresponding to the range of frequencies; calculating the equivalent input impedance based on the equation $$Zin = \frac{Z}{gm \times R0}$$

and calculating the multiplication of the impedance, Z, based on the equation multiplication=

$$Z\frac{IB2}{IB1}.$$

Additionally, the circuit of the third embodiment may be operated as a high pass filter by providing the alternating current source, $i_x$, by connecting a capacitor, $C_1$, to the first current input of the CFOA; connecting a voltage output, $V_o$, to the first end of the capacitor; connecting a first end of an alternating voltage source, $V_{in}$, to a second end of the capacitor, C1; connecting a second end of an alternating voltage source, $V_{in}$, to ground; sweeping the alternating voltage source over a range of frequencies; sweeping the amplitudes of the first bias current source, $i_{B1}$, of the $OTA_1$ and second bias current source, $i_{B2}$, of the $OTA_2$ at each of the frequencies; wherein the voltage output, Vo, is high pass filtered to a subset of the range of frequencies and the amplitude of the voltage output, $V_o$, is tuned by the multiplication of the impedance, Z.

Figure 12:
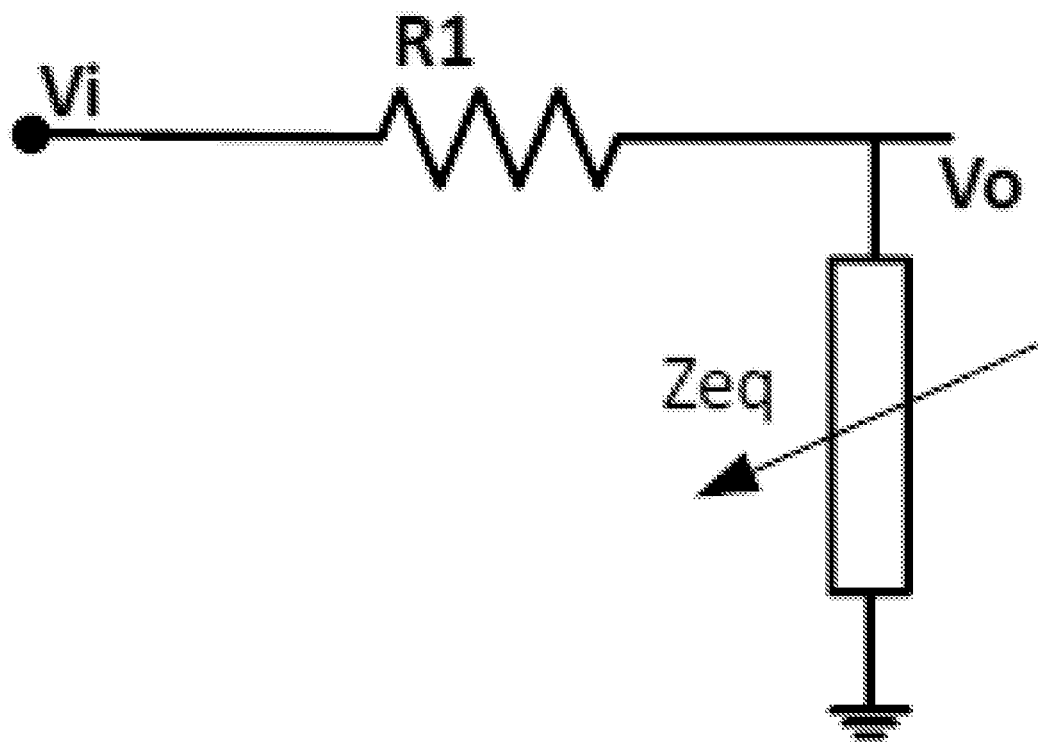
FIG. 12 illustrates the circuit used to simulate a negative impedance multiplier.
Figure 13:
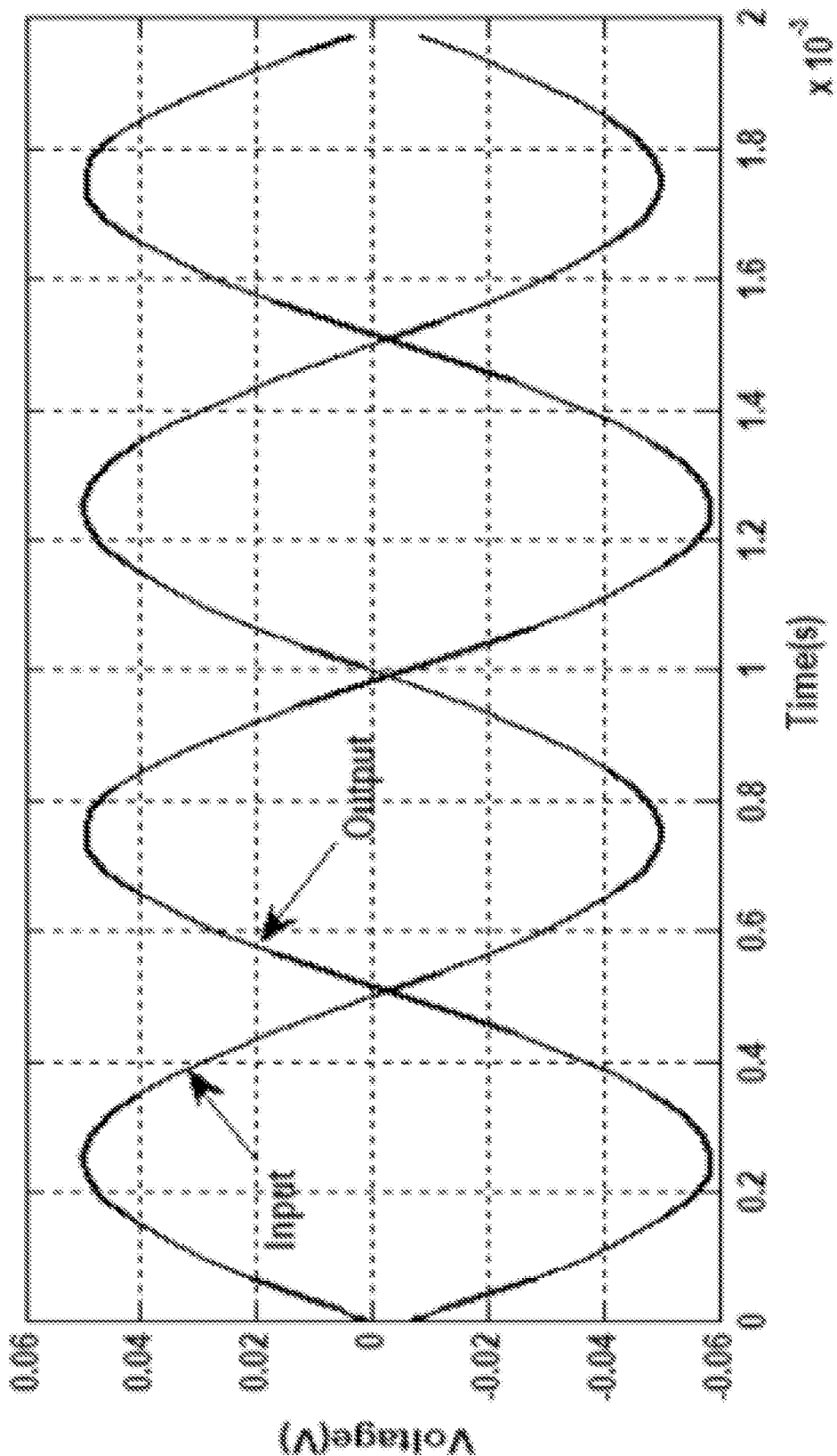
FIG. 13 is a graph illustrating the gain and phase shift for the high pass filter using the negative impedance multiplier.

To confirm the functionality of the design of the negative impedance multiplier, the multiplier was used to replace $Z_{eq}$ in a voltage divider circuit as shown in FIG. 12. The values used in simulation are as follows: $R_1$=10kΩ, $I_{B1}$=100 µA, $I_{B2}$=20 µA, and Z=5kΩ ($Z_{in}$=−5 kΩ). The output voltage was calculated to be −Vi. It is evident from the simulation results shown in FIG. 13 that the output voltage is negative and is in close agreement with the calculation. The offset shown comes from CFOA 102 (AD844).

Figure 14:
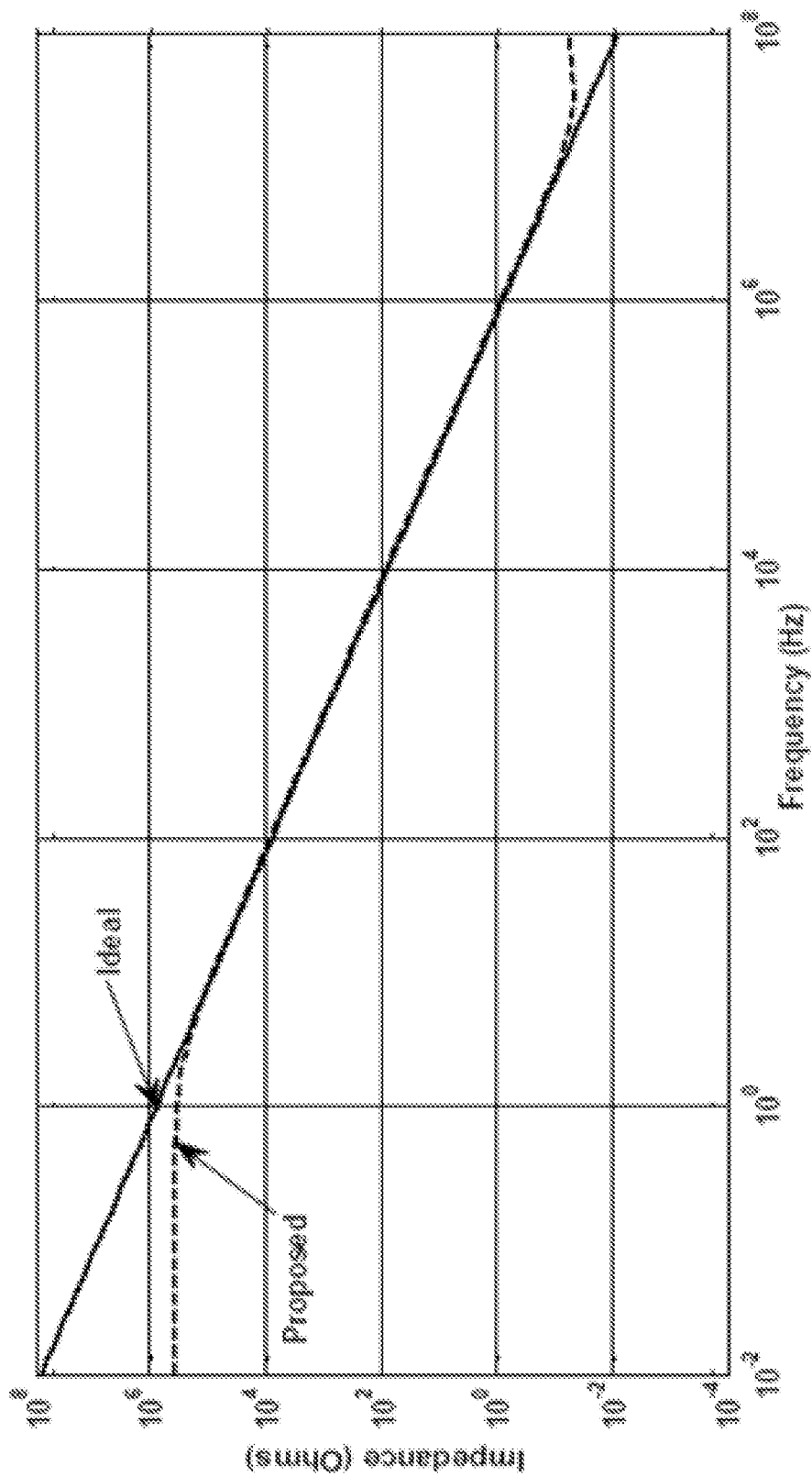
FIG. 14 is a graph illustrating the frequency response of the impedance multiplier.

The tunable impedance multiplier functions well in the frequency range 2 Hz to-7 MHz as can be shown in FIG. 14.

The tunable positive and negative impedance multiplier of the present disclosure was compared to previous multipliers and a summary of comparison is shown in Table I. It is clear from Table I that the tunable impedance multiplier outperforms known multipliers as it is tunable and can multiply both resistance and capacitance. Further, the multiplier can invert the sign of the impedance modified as in the circuit of FIG. 11.

TABLE I

SUMMARY OF PERFORMANCE COMPARISON

|  | [1] | [8] | [9] | [11] | This work |
| --- | --- | --- | --- | --- | --- |
| Multiplication factor | 1660 | 525 | 28 | 140 | 400 |
| # of passive elements | 2 | 0 | 0 | 0 | 0 |
| Tunability | NO | Yes | No | Yes | Yes |
| R & C multiplier | NO | NO | NO | NO | Yes |

A grounded impedance scaling circuit that can tunably multiply a capacitor or a resistor was presented. The design may use commercially available integrated circuits. The grounded tunable multiplier was shown to perform well as either a low pass or high pass filter with a tunable cut-off frequency. The multiplier of the present disclosure further is capable of being a positive or a negative impedance multiplier. FIG. 9 and FIG. 11 may be combined (not shown) by providing a double pole double pole switch, equivalent switch box, or switching transistor circuit at the inputs of $OTA_2$.

Obviously, numerous modifications and variations of the present invention are possible in light of the above teachings. It is therefore to be understood that within the scope of the appended claims, the invention may be practiced otherwise than as specifically described herein.

The invention claimed is:
1. A tunable impedance multiplier, comprising:
a current feedback operational amplifier, CFOA, having a current input Y, a current input X, a voltage output W and a voltage output P;
a first operational transconductance amplifier, $OTA_1$, having a gain $g_m$, a first positive voltage input V+, a first negative voltage input V−, a first bias current input $I_{B1}$, a positive supply voltage, a negative supply voltage, and a current output $I_o$;
a resistance, $R_0$, wherein the resistance $R_0$ is connected to the voltage output P at a first end and is connected to ground at a second end;
an impedance, Z, wherein the impedance Z is connected to the input X at a first end and is connected to ground at a second end;

wherein the voltage output W is connected to the voltage input V of $OTA_1$; and wherein the output Io is connected as feedback to the current input Y of the CFOA.

2. The tunable impedance multiplier of claim 1, wherein the impedance Z is a resistor or a capacitor and the equivalent input impedance, $Z_{in}$, of the impedance multiplier is given by the equation $$Zin = \frac{Z}{gm \times R0}.$$

3. The tunable impedance multiplier of claim 2, wherein $g_m = 20 \times I_{B_1}$ and the equivalent input impedance, $Z_{in}$, of the impedance multiplier is given by the equation $$Zin = \frac{Z}{20 \times IB1 \times R0}.$$

4. The tunable impedance multiplier of claim 3, wherein the impedance Z is a capacitor, C, and the equivalent capacitance of the impedance multiplier is given by $C_{eq} = (20 \times I_{B1} \times R_o)C$.

5. The tunable impedance multiplier of claim 4, further comprising a low pass filter circuit including:
a resistor, $R_1$, connected at a first end to the current input Y;
a voltage output, $V_o$, connected to the first end;
a first end of an alternating voltage source, $V_{in}$, connected to a second end of the resistor, R1;
a second end of the alternating voltage source, $V_{in}$, connected to ground.

6. The tunable impedance multiplier of claim 5, where the resistor $R_0$ is provided by a second operational transconductance amplifier, $OTA_2$, where the second operational transconductance amplifier includes an inverting voltage input, a non-inverting voltage input, a bias input, $I_{B2}$, a second positive and a second negative supply voltage, and a second current output which is connected to the inverting voltage input, wherein
the inverting voltage input is connected to the voltage output P and
the non-inverting voltage input is connected to ground.

7. The tunable impedance multiplier of claim 5, wherein the resistor $R_0$ is provided by a second operational transconductance amplifier, $OTA_2$, where the second operational transconductance amplifier includes an inverting voltage input, a non-inverting voltage input, a bias input, $I_{B2}$, a second positive and a second negative supply voltage, and a second current output which is connected to the inverting voltage input, wherein
the non-inverting input is connected to the voltage output P and
the inverting input is connected to ground.

8. The tunable impedance multiplier of claim 3, where the impedance Z is a resistor, $g_m = 20 \times I_{B1}$ and the equivalent resistance of the impedance multiplier is given by $$Req = \frac{R}{20 \times IB1 \times R0}.$$

9. The tunable impedance multiplier of claim 8, further comprising a high pass filter circuit including:
a capacitor, $C_1$, connected at a first end to the current input Y;
a voltage output, $V_o$, connected to the first end of the capacitor;
a first end of an alternating voltage source, $V_{in}$, connected to a second end of the capacitor, C1;
a second end of an alternating voltage source, $V_{in}$, connected to ground.

10. The tunable impedance multiplier of claim 9, where the resistor $R_0$ is provided by a second operational transconductance amplifier, $OTA_2$, where the second operational transconductance amplifier includes an inverting voltage input, a non-inverting voltage input, a bias input, $I_{B2}$, a second positive and a second negative supply voltage, and a second current output which is connected to the inverting voltage input, wherein
the inverting voltage input is connected to the voltage output P and
the non-inverting voltage input is connected to ground.

11. The tunable impedance multiplier of claim 9, wherein the resistor $R_0$ is provided by a second operational transconductance amplifier, $OTA_2$, where the second operational transconductance amplifier includes an inverting voltage input, a non-inverting voltage input, a bias input, $I_{B2}$, a second positive and a second negative supply voltage, and a second current output which is connected to the inverting voltage input, wherein
the non-inverting input is connected to the voltage output P and
the inverting input is connected to ground.

12. The tunable impedance multiplier of claim 1, where the resistance $R_0$ is provided by a second operational transconductance amplifier, $OTA_2$, where the second operational transconductance amplifier includes an inverting voltage input, a non-inverting voltage input, a bias input, $I_{B2}$, a second positive and a second negative supply voltage, and a second current output which is connected to the inverting voltage input, wherein
the inverting voltage input is connected to the voltage output P and
the non-inverting voltage input is connected to ground.

13. The tunable impedance multiplier of claim 12, wherein the impedance Z is a resistor or a capacitor and the equivalent input impedance, $Z_{in}$, of the impedance multiplier is given by the equation $$Zin = Z\frac{IB2}{IB1}.$$

14. The tunable impedance multiplier of claim 1, wherein the resistance $R_0$ is provided by a second operational transconductance amplifier, $OTA_2$, where the second operational transconductance amplifier includes an inverting voltage input, a non-inverting voltage input, a bias input, $I_{B2}$, a second positive and a second negative supply voltage, and a second current output which is connected to the inverting voltage input, wherein
the non-inverting input is connected to the voltage output P and
the inverting input is connected to ground.

15. The tunable impedance multiplier of claim 14, wherein the impedance Z is a resistor or a capacitor and the equivalent input impedance, $Z_{in}$, of the impedance multiplier is given by the equation $$Zin = -Z\frac{IB2}{IB1}.$$

16. A method for tunably multiplying an impedance, comprising:
connecting an alternating current source, $i_x$, to a first current input of a current feedback operational amplifier, CFOA;
connecting a second current input of the CFOA to an impedance, Z;
connecting a first output of the CFOA to an inverting input of a first operational transconductance amplifier, $OTA_1$ having a specified gain, $g_m$;
connecting a second output of the CFOA to a grounded resistance, $R_o$;
connecting a non-inverting input of the $OTA_1$ to ground;
connecting a current output, $I_o$, of the $OTA_1$ to the first current input of the CFOA;
sweeping the amplitude of a first bias current source, $i_{B1}$, connected to a bias input of the $OTA_1$ over a range of frequencies of alternating current $i_x$;
determining the −3 dB points of the current output corresponding to the range of frequencies; and
calculating the equivalent input impedance based on the equation $$Zin = \frac{Z}{gm \times R0}.$$

17. The method for tunably multiplying an impedance of claim 16, further comprising:
providing the grounded resistance, $R_o$, by connecting an inverting input of a second operational transconductance amplifier, $OTA_2$ to a second voltage output of the CFOA, connecting the non-inverting input of the $OTA_2$ to ground and connecting the output of the $OTA_2$ to the inverting input of the $OTA_2$;
connecting a second bias current source, $i_{B2}$, to a bias input of the $OTA_2$;
sweeping the amplitudes of the first bias current source, $i_{B1}$, of the $OTA_1$ and second bias current source, $i_{B2}$, of the $OTA_2$ over a range of frequencies of alternating current $i_x$,
wherein the value of the impedance, Z, is positive and multiplied by the factor $$\frac{IB2}{IB1}.$$

18. The method for tunably multiplying an impedance of claim 16, further comprising:
providing the grounded resistance, $R_o$, by connecting a non-inverting input of a second operational transconductance amplifier, $OTA_2$ to a second voltage output of the CFOA, connecting the inverting input of the $OTA_2$ to ground and connecting the output of the $OTA_2$ to the inverting input of the $OTA_2$;
connecting a second bias current source, $i_{B2}$, to a bias input of the $OTA_2$;
sweeping the amplitudes of the first bias current source, $i_{B1}$, of the $OTA_1$ and second bias current source, $i_{B2}$, of the $OTA_2$ over a range of frequencies of alternating current $i_x$,
wherein the value of the impedance, Z, is negative and multiplied by the factor $$\frac{IB2}{IB1}.$$

19. A method for tunably multiplying an impedance, comprising:
connecting an alternating current source, $i_x$, to a first current input of a current feedback operational amplifier, CFOA;
connecting a second current input of the CFOA to an impedance, Z;
connecting a first output of the CFOA to an inverting input of a first operational transconductance amplifier, $OTA_1$ having a specified gain, $g_m$;
connecting a non-inverting input of the $OTA_1$ to ground;
connecting a current output of the $OTA_1$ to the first current input of the CFOA;
connecting an inverting input of a second operational transconductance amplifier $OTA_2$ to a second voltage output of the CFOA, connecting the non-inverting input of the $OTA_2$ to ground and connecting the output of the $OTA_2$ to the inverting input of the $OTA_2$;
connecting a second bias current source, $i_{B2}$, to a bias input of the $OTA_2$;
sweeping the amplitudes of the first bias current source, $i_{B1}$, of the $OTA_1$ and second bias current source, $i_{B2}$, of the $OTA_2$ over a range of frequencies of alternating current $i_x$,
determining the −3 dB points of the current output corresponding to the range of frequencies;
calculating the equivalent input impedance based on the equation $$Zin = \frac{Z}{gm \times R0};$$

and
calculating the multiplication of the impedance, Z, based on the equation multiplication=

$$Z\frac{IB2}{IB1}.$$

20. The method for tunably multiplying an impedance of claim 19, further comprising
providing the alternating current source, $i_x$, by
connecting a capacitor, $C_1$, to the first current input of the CFOA;
connecting a voltage output, $V_o$, to the first end of the capacitor;
connecting a first end of an alternating voltage source, $V_{in}$, to a second end of the capacitor, C1;
connecting a second end of an alternating voltage source, $V_{in}$, to ground;

sweeping the alternating voltage source over a range of frequencies;
sweeping the amplitudes of the first bias current source, $i_{B1}$, of the $OTA_1$ and second bias current source, $i_{B2}$, of the $OTA_2$ at each of the frequencies;
wherein the voltage output, Vo, is high pass filtered to a subset of the range of frequencies and the amplitude of the voltage output, $V_o$, is tuned by the multiplication of the impedance, Z.

\* \* \* \* \*